United States Patent
Fujieda

(10) Patent No.: US 7,358,718 B2
(45) Date of Patent: Apr. 15, 2008

(54) SEMICONDUCTOR DEVICE AND ELECTRONICS DEVICE

(75) Inventor: Waichiro Fujieda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 126 days.

(21) Appl. No.: 11/434,736

(22) Filed: May 17, 2006

(65) Prior Publication Data

US 2007/0205755 A1 Sep. 6, 2007

(30) Foreign Application Priority Data

Feb. 17, 2006 (JP) ............................. 2006-040379

(51) Int. Cl.
*G01R 31/26* (2006.01)
(52) U.S. Cl. .................. 324/158.1; 324/763; 324/765; 324/769
(58) Field of Classification Search ..................... None
See application file for complete search history.

(56) References Cited

U.S. PATENT DOCUMENTS 6,504,402 B2 * 1/2003 Horiguchi et al. .......... 326/121
6,946,865 B2 * 9/2005 Mizuno et al. .............. 324/765

FOREIGN PATENT DOCUMENTS

WO 00/11486 A1 3/2000

* cited by examiner

*Primary Examiner*—Minh N. Tang
(74) *Attorney, Agent, or Firm*—Arent Fox LLP

(57) ABSTRACT

A plurality of switch circuits are disposed so as to correspond to a plurality of circuit blocks, respectively. Each of the plurality of switch circuits is connected between a power supply terminal of a corresponding circuit block and a power supply line. A setting circuit is disposed to set each of the plurality of switch circuits to be in a valid or invalid state. A switch control circuit turns on each of the plurality of switch circuits according to a first control signal for indicating an operation state of the plurality of circuit blocks when each of the plurality of switch circuits is set in a valid state by the setting circuit and turns on each of the plurality of switch circuits regardless of the first control signal when each of the plurality of switch circuits is set in an invalid state by the setting circuit.

12 Claims, 15 Drawing Sheets

SEMICONDUCTOR DEVICE AND ELECTRONICS DEVICE

CROSS REFERENCE TO RELATED APPLICATION

This application is based upon and claims the benefit of priority from Japanese Patent Application No. 2006-040379, filed on Feb. 17, 2006, the entire contents of which are incorporated herein by reference.

BACKGROUND OF THE INVENTION

1. Field of the Invention

The invention relates to a semiconductor device and an electronics device composed of the same.

2. Description of the Related Art

In recent years, portable electronics devices (a mobile phone, etc.) driven with a battery have been popular. There has been a strong demand for semiconductor devices mounted in the portable electronics devices to operate at a high-speed with low power consumption in order to realize advanced functions of the electronics devices and a long-term use of a battery.

Furthermore, along with the miniaturization of the structure of semiconductor devices, a power supply voltage applied to the semiconductor devices has been lowered. A small difference between the power supply voltage and a threshold voltage of the transistor due to low power supply voltage makes it difficult for the transistor to turn on, thereby decreasing the operating speed of the semiconductor device. To realize the high-speed operation of the semiconductor device with a low power supply voltage, it is necessary to set low the threshold voltage of the transistor. However, sub-threshold leakage current (off-state leakage current) of the transistor during an off state increases as the threshold voltage of the transistor lowers or an operation temperature rises. As a result, at a low set threshold voltage of the transistor, the high-speed operation of the semiconductor device is achievable, however, power consumption in the standby period of the semiconductor device increases.

In a semiconductor device including a plurality of circuit blocks, for example, a threshold voltage of the transistor within the circuit block is set low in order to realize the high-speed operation, and a switch transistor (a leakage cut-off transistor) is disposed between the power supply terminal of the circuit block and the power supply line to turn on in the active period and turn off in the standby period, in order to achieve low power consumption by reducing off-state leakage current of the transistor in the standby period.

Also, WO00/11486 discloses a technique to easily, accurately detect whether there is leakage current larger than a predetermined value in a semiconductor device.

The semiconductor device with the function of curtailing off-state leakage current (a leakage cut-off function) using the leakage cut-off transistor includes a test mode (the leakage cut-off function is invalid) in which the leakage cut-off transistor is constantly turned on regardless of an operation state of the semiconductor device, in addition to a normal mode (the leakage cut-off function is valid) in which the leakage cut-off transistor is turned on according to an operation state of the semiconductor device.

In a test process of the semiconductor device as described above, a function test is performed in the normal mode. When a result of the test is a fail, the function test is performed again in the test mode. It is possible to determine whether defects have occurred due to the leakage cut-off function based on the result of the test, pass/fail, in the test mode. It is, however, not possible to find details of the defects such as to identify a circuit block having the defects due to the leakage cut-off function from a plurality of circuit blocks. Because of this, defect analysis cannot be efficiently performed, consuming an enormous amount of time.

SUMMARY OF THE INVENTION

It is an object of the invention to efficiently analyze defects due to the leakage cut-off function in a short period of time.

According to an aspect of the invention, a semiconductor device mounted in an electronics device includes a plurality of circuit blocks, a plurality of switch circuits, a setting circuit and a switch control circuit. The plurality of switch circuits are disposed so as to correspond to the plurality of circuit blocks, respectively. Each of the plurality of switch circuits is connected between a power supply terminal of a corresponding circuit block and a power supply line. The setting circuit is disposed to set each of the plurality of switch circuits to be in a valid or invalid state. When each of the switch circuits is set in the valid state by the setting circuit, the switch control circuit turns on each switch circuit in accordance with a first control signal, and when each of the switch circuits is set in the invalid state by the setting circuit, turns on each switch circuit regardless of the first control signal. The first control signal indicates an operation state (an active state or a standby state) of the plurality of circuit blocks.

Accordingly, being set to be valid by the setting circuit, each of the switch circuits turns on in the active period of the plurality of circuit blocks (the active period of the semiconductor device) and turns off in the standby period of the plurality of circuit blocks (the standby period of the semiconductor device). Therefore, for example, when all of the switch circuits are set to 'valid' by the setting circuit, it is possible to reduce off-state leakage current of all the circuit blocks in the standby period of the semiconductor device. This accordingly makes both of high-speed operation and low power consumption of the semiconductor device feasible at the same time, even when a threshold voltage of a transistor in each circuit block is set low in order to realize the high-speed operation.

In the test process of such a semiconductor device, the function test is performed in a state that all of the switch circuits are set to 'valid' by the setting circuit. When the result of the function test is a fail, the function test is sequentially performed while the state (valid or invalid) of each switch circuit is changed by the setting circuit. Based on the results of the function tests, pass/fail, and on the state of each switch circuit, it is possible to find where a defect occurs due to the leakage cut-off function. Therefore, defect analysis can be performed efficiently in a short period of time.

In a preferable example of one aspect of the invention, the setting circuit includes a test mode circuit. In a normal mode the test mode circuit inactivates a plurality of test mode signals corresponding to the plurality of switch circuits respectively. In a test mode the test mode circuit activates one of the plurality of test mode signals designated by test mode information. The switch control circuit turns on each of the plurality of switch circuits in accordance with the first control signal when a corresponding test mode signal is inactivated, and turns on each of the plurality of switch circuits regardless of the first control signal when the corresponding test mode signal is activated.

In the test process of such a semiconductor device, the function test is performed in the normal mode. When the result of the function test is a fail, the function test is sequentially performed while the state (active or inactive) of each test mode signal is changed according to the test mode information. Based on the results of the function tests, pass/fail, and on the state of each test mode signal, it is possible to find which one of the plurality of circuit blocks has a defect due to the leakage cut-off function.

In a preferable example of the aspect of the invention, the setting circuit includes a plurality of storage circuits. The plurality of storage circuits are disposed so as to correspond to the plurality of switch circuits, respectively. Each of the plurality of storage circuits stores validity or invalidity of a corresponding switch circuit and activates a storage state signal when storing the invalidity. For example, each of the plurality of storage circuits may include a fuse circuit programming validity or invalidity of the corresponding switch circuit. The switch control circuit turns on each of the plurality of switch circuits in accordance with the first control signal when a corresponding storage state signal is inactivated and turns on each of the plurality of switch circuits regardless of the first control signal when the corresponding storage state signal is activated.

In the test process of such a semiconductor device, the function test is performed in a state that all of the storage circuits store validity. When the result of the function test is a fail, the function test is sequentially performed while the number of the storage circuits storing the invalidity is increased. Based on the results of the function tests, pass or fail, and on the state (that validity or invalidity is stored) of each storage circuit, it is possible to find which one of the plurality of circuit blocks has a defect due to the leakage cut-off function.

In a preferred example of the aspect of the invention, the setting circuit includes a test mode circuit, a plurality of storage circuits and a uniting circuit. In the normal mode the test mode circuit inactivates a plurality of test mode signals corresponding to the plurality of switch circuits, respectively. In a test mode the test mode circuit activates one of the plurality of test mode signals designated by the test mode information. The plurality of storage circuits are disposed so as to correspond to the plurality of switch circuits respectively, store validity or invalidity of a corresponding switch circuit, and activates a storage state signal when storing the invalidity. For example, each of the plurality of storage circuits may include a fuse circuit programming validity or invalidity of the corresponding switch circuit. The uniting circuit activates each of a plurality of second control signals corresponding to the plurality of switch circuits respectively when one of a corresponding test mode signal and a corresponding storage state signal is activated. The switch control circuit turns on each of the plurality of switch circuits in accordance with the first control signal when a corresponding second control signal is inactivated, and turns on each of the plurality of switch circuits regardless of the first control signal when the corresponding second control signal is activated.

In the test process of such a semiconductor device, the function test is performed in the normal mode in a state that all of the storage circuits store validity. When the result of the function test is a fail, the function test is sequentially performed in the test mode while the state of each test mode signal is changed according to test mode information. Based on the results of the function tests, pass/fail, and on the state of each test mode signal, it is possible to find which one of the plurality of circuit blocks has a defect due to the leakage cut-off function.

Furthermore, once the invalidity is stored in a storage circuit corresponding to a circuit block having a defect, the result of the function test of the circuit block in the normal mode will be "pass". However, in the circuit block, the off-state leakage current is not reduced, thereby slightly increasing power consumption of the semiconductor device in the standby period. However, if the power consumption increase is not a big problem for a user of the semiconductor device, the semiconductor device can be provided as a good product without waiting for correcting the defect.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
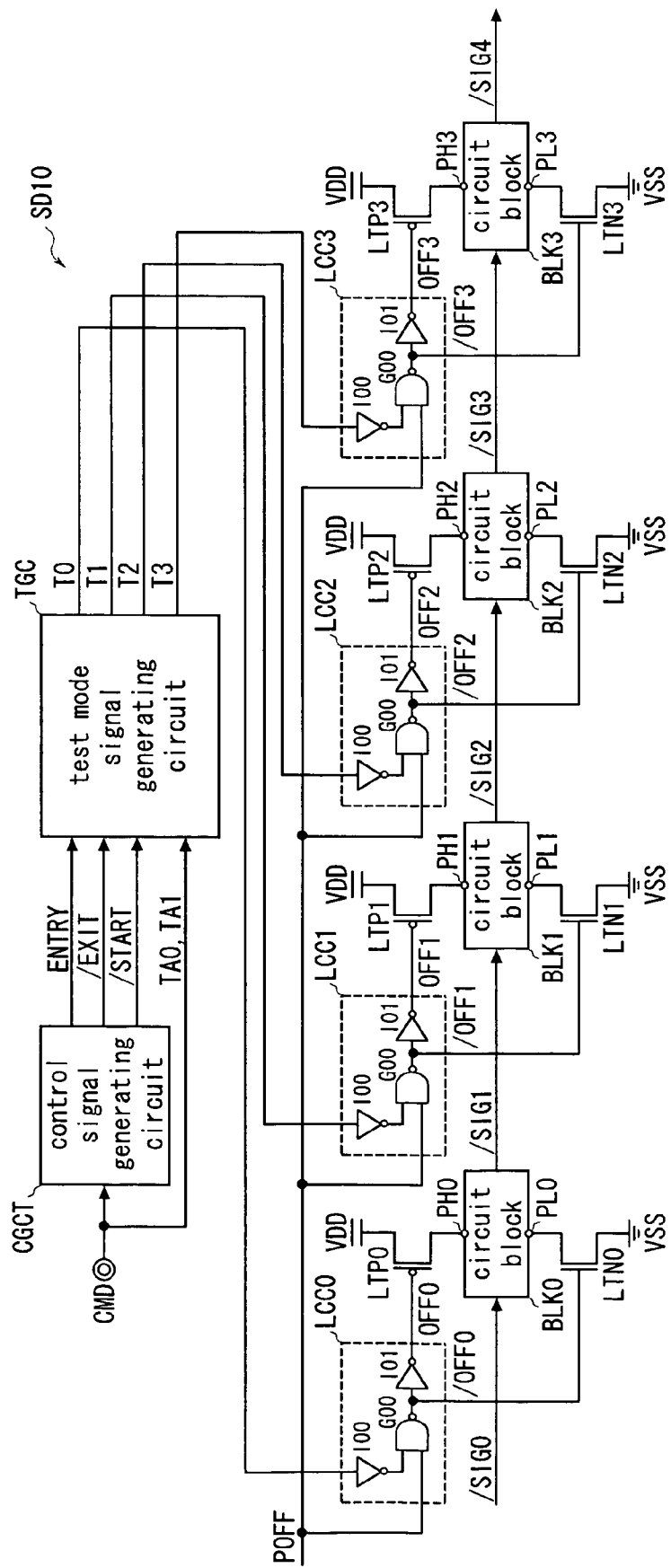
FIG. 1 is a circuit diagram showing a first embodiment of the invention.
Figure 2A:
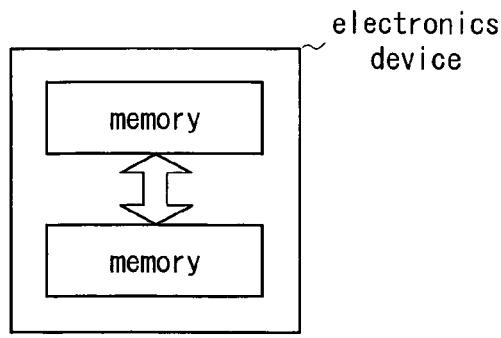
FIGS. 2(a) to 2(d) are explanatory views showing an electronics device in which a semiconductor device of FIG. 1 is mounted.
Figure 2B:
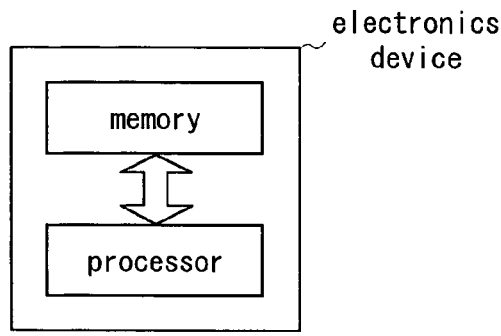
Figure 2C:
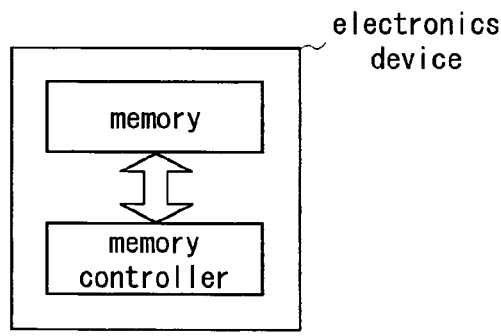
Figure 2D:
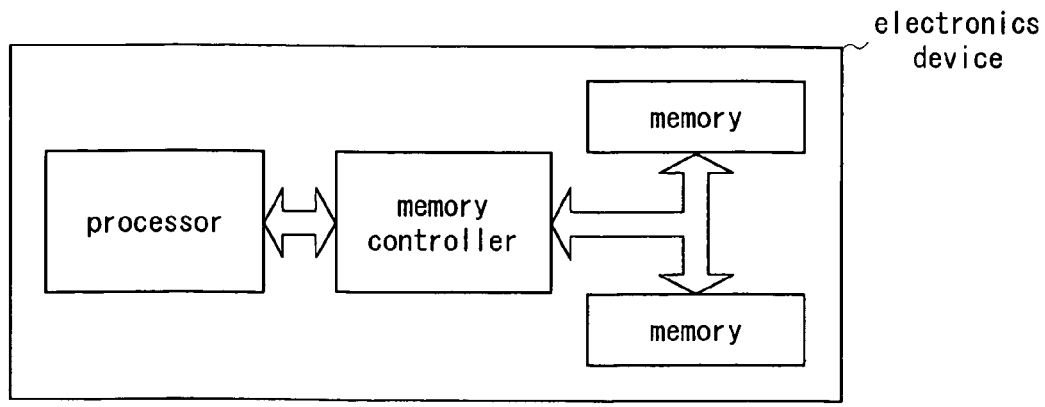

Hereinafter, embodiments of the invention will be described with reference to the accompanying drawings. FIG. 1 shows a first embodiment of the invention. FIGS. 2(a) to 2(d) show an electronics device in which a semiconductor device of FIG. 1 is mounted. The semiconductor device SD10 according to the first embodiment may be mounted in an electronics device having a function block construction as shown in FIGS. 2(a) to 2(d). The semiconductor device SD10 may implement at least one of the function blocks (a memory, a processor, or a memory controller). Furthermore, the electronics devices may be constructed by using any one of MCP (Multi Chip Package), SiP (System in Package) and SoC (System on Chip) techniques.

The semiconductor device SD10 includes a control signal generating circuit CGCT, a test mode signal generating circuit TGC (a test mode circuit), leakage cut-off control circuits LCC0 to LCC3 (a switch control circuit), circuit blocks BLK0 to BLK3 and leakage cut-off transistors LTP0 to LTP3 and LTN0 to LTN3 (switch circuits).

When the control signal generating circuit CGCT analyzes a command signal CMD received through a command terminal CMD and detects a test mode entry command, the control signal generating circuit CGCT temporarily activates a test mode entry signal ENTRY to '1'. When the control signal generating circuit CGCT analyzes the command signal CMD and detects a test mode exit command, the control signal generating circuit CGCT temporarily activates a test mode exit signal /EXIT to '0'. The control signal generating circuit CGCT also temporarily activates a start signal /START to '0' when the semiconductor device SD10 is powered.

The test mode signal generating circuit TGC outputs test mode signals T0 to T3 on the basis of the test mode entry signal ENTRY, the test mode exit signal /EXIT, the start signal /START, and address signals TA0 and TA1 (test mode information) for identifying a test mode of the command signal CMD. When the operation mode of the semiconductor device SD10 is a normal mode, all of the test mode signals T0 to T3 are inactivated to '0'. When the operation mode of the semiconductor device SD10 is a test mode, at least one of the test mode signals T0 to T3 is activated to '1'.

The leakage cut-off control circuit LCCi (i=0, 1, 2, 3) has inverters I00 and I01 and a NAND gate G00. The inverter I00 inverts the test mode signal Ti and outputs the inverted signal. The NAND gate G00 performs a NAND operation for a leakage cut-off control signal POFF (first control signal) and an output signal of the inverter I00 and outputs the result as a leakage cut-off control signal /OFFi. The inverter I01 inverts the leakage cut-off control signal /OFFi (output signal of the NAND gate G00) and outputs the inverted signal as a leakage cut-off control signal OFFi. Furthermore, the leakage cut-off control signal POFF is activated to '1' in the standby period of the semiconductor device SD10 (standby period of the circuit blocks BLK0 to BLK3) and is inactivated to '0' in the active period of the semiconductor device SD10 (active period of the circuit blocks BLK0 to BLK3).

Therefore, if the test mode signal Ti is inactivated to '0', the leakage cut-off control signals OFFi and /OFFi are activated to '1' and '0', respectively, in the standby period of the semiconductor device SD10 and are inactivated to '0' and '1', respectively, in the active period of the semiconductor device SD10. Meanwhile, if the test mode signal Ti is activated to '1', the leakage cut-off control signals OFFi and /OFFi are respectively inactivated to '0' and '1' regardless of the operation state of the semiconductor device SD10 (operation state of the circuit blocks BLK0 to BLK3).

The circuit block BLKi outputs an internal signal /SIGi+1 on the basis of an internal signal /SIGi. The internal signal /SIG0 is temporarily activated to '0' only in the active period of the semiconductor device SD10 at a desired timing. The leakage cut-off transistor LTPi includes a PMOS transistor and is connected between a power supply terminal PHi of the circuit block BLKi and a power supply line VDD. A leakage cut-off transistor LTNi includes an nMOS transistor and is connected between a power supply terminal PLi of the circuit block BLKi and a ground line VSS. The leakage cut-off transistor LTPi has a gate to which the leakage cut-off control signal OFFi is applied. The leakage cut-off transistor LTNi has a gate to which the leakage cut-off control signal and /OFFi is applied.

Therefore, if the test mode signal Ti is inactivated to '0', the leakage cut-off transistors LTPi and LTNi are turned on in the active period of the semiconductor device SD10 and are turned off in the standby period of the semiconductor device SD10. Meanwhile, if the test mode signal Ti is activated to '1', the leakage cut-off transistors LTPi and LTNi are always turned on regardless of the operation state of the semiconductor device SD10. In other words, the leakage cut-off transistors LTPi and LTNi are set to 'valid' when the test mode signal Ti is inactivated to '0' and is set to 'invalid' when the test mode signal Ti is activated to '1'.

Figure 3:
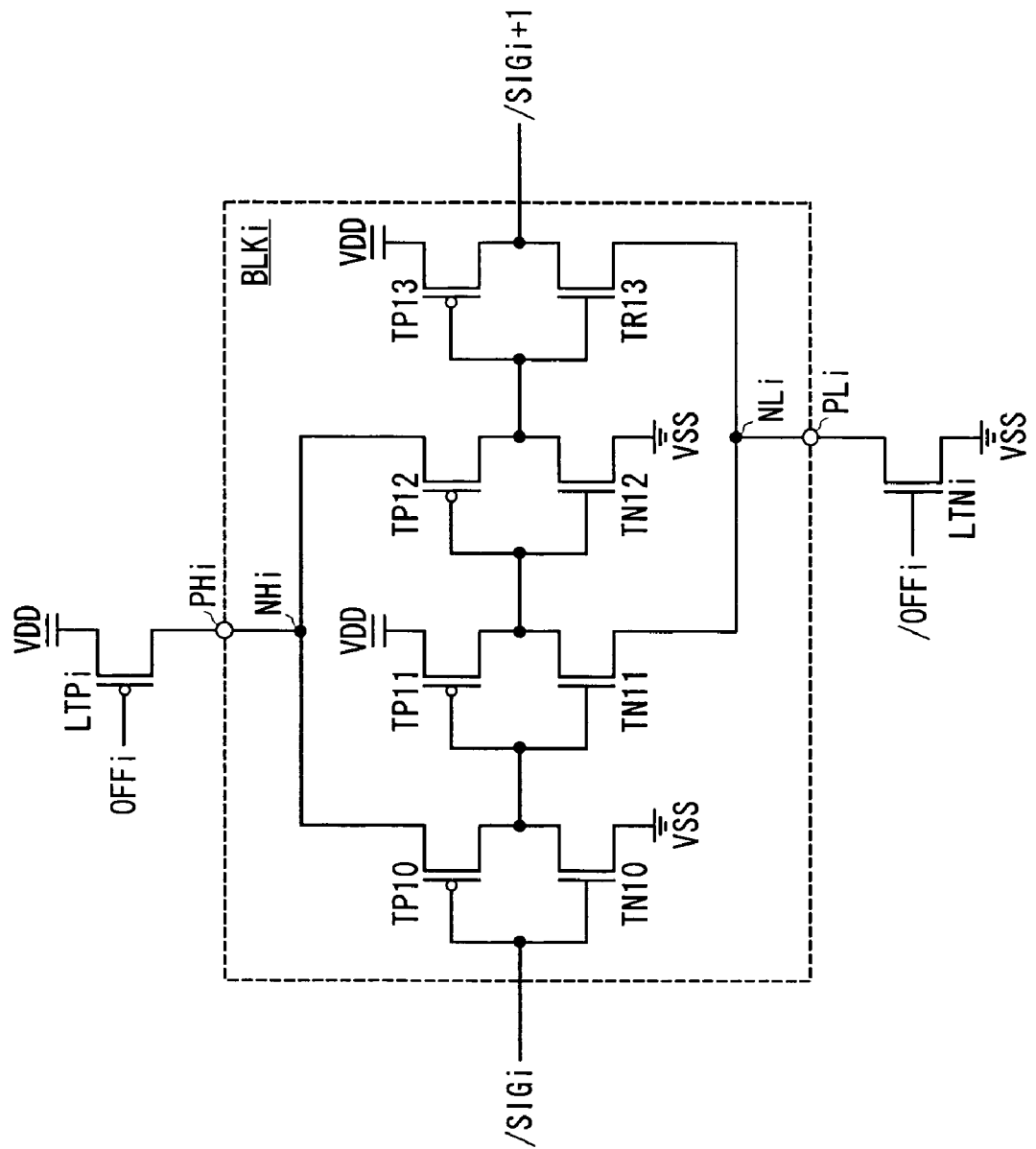
FIG. 3 is a circuit diagram showing a circuit block in FIG. 1.

FIG. 3 shows a circuit block in FIG. 1. The circuit block BLki includes pMOS transistors TP10 to TP13 and nMOS transistors TN10 to TN13. The pMOS transistor TP10 has a source connected to the power supply terminal PHi. In other words, the source of the pMOS transistor TP10 is connected to the power supply line VDD through the leakage cut-off transistor LTPi. A drain of the pMOS transistor TP10 is connected to a drain of the nMOS transistor TN10. The nMOS transistor TN10 has a source connected to the ground line VSS. Gates of the pMOS transistor TP10 and the nMOS transistor TN10 are applied with the internal signal /SIGi.

The PMOS transistor TP11 has a source connected to the power supply line VDD. A drain of the pMOS transistor TP11 is connected to a drain of the nMOS transistor TN11. The nMOS transistor TN11 has a source connected to the power supply terminal PLi. In other words, the source of the nMOS transistor TN11 is connected to the ground line VSS through the leakage cut-off transistor LTNi. Gates of the pMOS transistor TP11 and the nMOS transistor TN11 are applied with a signal generated in the connection node of the pMOS transistor TP10 and the nMOS transistor TN10.

The pMOS transistor TP12 has a source connected to the power supply terminal PHi. In other words, the source of the pMOS transistor TP12 is connected to the power supply line VDD through the leakage cut-off transistor LTPi. A drain of the pMOS transistor TP12 is connected to a drain of the nMOS transistor TN12. The nMOS transistor TN12 has a source connected to the ground line VSS. Gates of the pMOS transistor TP12 and the nMOS transistor TN12 are applied with a signal generated in the connection node of the pMOS transistor TP11 and the nMOS transistor TN11.

The pMOS transistor TP13 has a source connected to the power supply line VDD. A drain of the pMOS transistor TP13 is connected to a drain of the nMOS transistor TN13. The nMOS transistor TN13 has a source connected to the power supply terminal PLi. In other words, the source of the nMOS transistor TN13 is connected to the ground line VSS through the leakage cut-off transistor LTNi. Gates of the PMOS transistor TP13 and the nMOS transistor TN13 are applied with a signal generated in the connection node of the pMOS transistor TP12 and the nMOS transistor TN12. A signal generated in the connection node of the pMOS transistor TP13 and the nMOS transistor TN13 is output as the internal signal /SIGi+1. As described above, the circuit block BLki includes the four inverters connected in series.

Furthermore, to realize the high speed operation of the circuit block BLki, threshold voltages of the pMOS transistors TP10 and TP12, which are turned on when the internal signal /SIGi is activated, may be set lower than those of the pMOS transistors TP11 and TP13, which are turned off when the internal signal /SIGi is activated. Similarly, threshold voltages of the nMOS transistors TN11 and TN13, which are turned on when the internal signal /SIGi is activated, may be set lower than those of the nMOS transistors TN10 and TN12, which are turned off when the internal signal /SIGi is activated.

In the standby period of the semiconductor device SD10, since the internal signal /SIG0 is inactivated to '1', the internal signals /SIG1 to /SIG4 are also inactivated to '1'. Accordingly, in the standby period of the semiconductor device SD10, the pMOS transistors TP10 and TP12 and the nMOS transistors TN11 and TN13 in which the threshold voltages are set low are turned off. Furthermore, sources of the PMOS transistors TP10 and TP12 are connected to the power supply line VDD through the leakage cut-off transistor LTPi. Sources of the nMOS transistors TN11 and TN13 are connected to the ground line VSS through the leakage cut-off transistor LTNi. When the operation mode of the semiconductor device SD10 is the normal mode, the leakage cut-off transistors LTPi and LTNi are turned off in the standby period of the semiconductor device SD10. As a result, in the standby period of the semiconductor device SD10, off-state leakage current occurring in the circuit blocks BLK0 to BLK3 can be significantly reduced. Consequently, it is possible to prevent the power consumption of the semiconductor device SD10 from being increased when the threshold voltages of the pMOS transistors TP10 and TP12 and the threshold voltages of the nMOS transistors TN11 and TN13 are set low. Therefore, both the high-speed operation and low power consumption of the semiconductor device SD10 can be realized. Furthermore, in the present embodiment, it has been described that the circuit blocks BLK0 to BLK3 have the same internal construction. However, the circuit blocks BLK0 to BLK3 may have different internal constructions.

Figure 4:
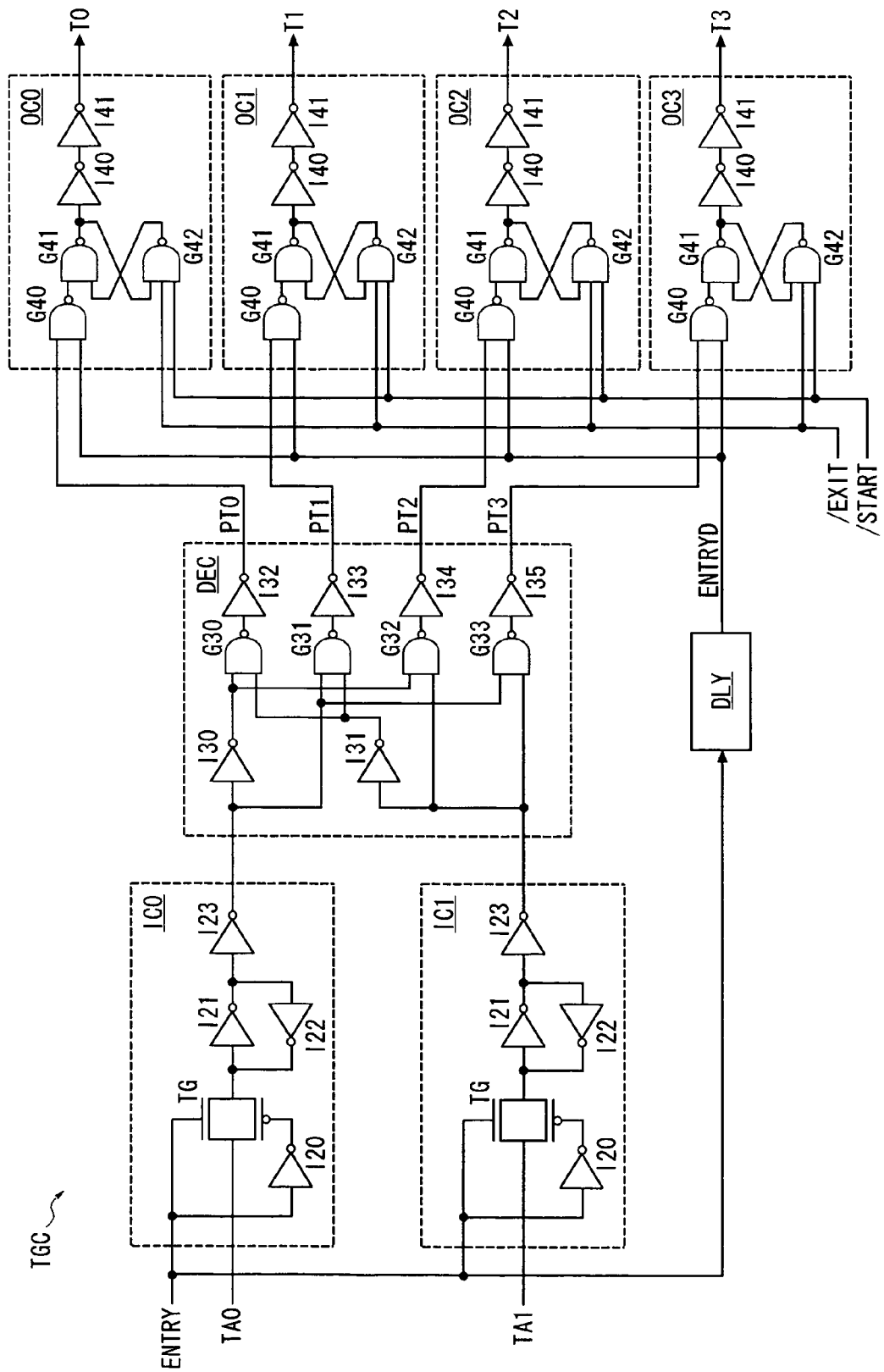
FIG. 4 is a circuit diagram showing a test mode signal generating circuit in FIG. 1.

FIG. 4 shows a test mode signal generating circuit in FIG. 1. The test mode signal generating circuit TGC includes input circuits IC0 and IC1, a decode circuit DEC, and output circuits OC0 to OC3. The input circuit IC0 (IC1) has a transfer gate TG and inverters I20 to I23. The transfer gate TG includes a PMOS transistor and an nMOS transistor, which are connected in parallel. A gate of the PMOS transistor of the transfer gate TG is applied with the test mode entry signal ENTRY through the inverter I20. A gate of the nMOS transistor of the transfer gate TG is applied with the test mode entry signal ENTRY. Therefore, the transfer gate TG is turned on when the test mode entry signal ENTRY is activated, and supplies an address signal TA0 (TA1), which is received through one end, to the other end. The transfer gate TG is turned off when the test mode entry signal ENTRY is inactivated and stops to supply the address signal TA0 (TA1) to the other end. The inverters I21 and I22 are connected in a ring form so as to form a latch circuit. A connection node of an input terminal of the inverter I21 and an output terminal of the inverter I22 is connected to the other end of the transfer gate TG. The inverter I23 inverts the output signal of the inverter I21 and outputs the inverted signal.

In the input circuit IC0 (IC1) constructed as described above, if the command signal CMD for indicating the test mode entry command is input to the control signal generating circuit CGCT and the test mode entry signal ENTRY supplied from the control signal generating circuit CGCT is activated, the transfer gate TG is turned on and the address signal TA0 (TA1) is supplied to the latch circuit including the inverters I21 and I22. Therefore, the output signal of the inverter I23 is set to the same logic level as that of the address signal TA0 (TA1) of the command signal CMD for indicating the test mode entry command.

The decode circuit DEC includes inverters I30 to I35 and NAND gates G30 to G33. The inverter I30 inverts the output signal (the output signal of the inverter I23 of the input circuit IC0) of the input circuit IC0 and outputs the inverted signal. The inverter I31 inverts the output signal (the output signal of the inverter I23 of the input circuit IC1) of the input circuit IC1 and outputs the inverted signal. The NAND gate G30 performs an NAND operation for the output signal of the inverter I30 and the output signal of the inverter I31 and outputs the operation result. The NAND gate G31 performs an NAND operation for the output signal of the input circuit IC0 and the output signal of the inverter I31 and outputs the operation result. The NAND gate G32 performs an NAND operation for the output signal of the inverter I30 and the output signal of the input circuit IC1 and outputs the operation result. The NAND gate G33 performs an NAND operation for the output signal of the input circuit IC0 and the output signal of the input circuit IC1 and outputs the operation result. The inverter I32 inverts the output signal of the NAND gate G30 and outputs the inverted signal as the test mode signal PT0. The inverter I33 inverts the output signal of the NAND gate G31 and outputs the inverted signal as the test mode signal PT1. The inverter I34 inverts the output signal of the NAND gate G32 and outputs the inverted signal as the test mode signal PT2. The inverter I35 inverts the output signal of the NAND gate G33 and outputs the inverted signal as the test mode signal PT3.

Through such a circuit construction, the test mode signal PT0 is activated to '1' when the output signal of the input circuit IC0 is set to '0' and the output signal of the input circuit IC1 is set to '0'. The test mode signal PT1 is activated to '1' when the output signal of the input circuit IC0 is set to '0' and the output signal of the input circuit IC1 is set to '1'. The test mode signal PT2 is activated to '1' when the output signal of the input circuit IC0 is set to '1' and the output signal of the input circuit IC1 is set to '0'. The test mode signal PT3 is activated to '1' when the output signal of the input circuit IC0 is set to '1' and the output signal of the input circuit IC1 is set to '1'.

A delay circuit DLY delays the test mode entry signal ENTRY by a predetermined time and outputs the delayed signal as a test mode entry signal ENTRYD. The predetermined time may be set such that the test mode entry signal ENTRYD is activated after any one of the test mode signals PT0 to PT3 is activated when the test mode entry signal ENTRY is activated.

The output circuit OCi includes NAND gates G40 to G42 and inverters I40 and I41. The NAND gate G40 performs an NAND operation for the test mode signal PTi and the test mode entry signal ENTRYD and outputs the operation result. The NAND gate G41 performs an NAND operation for the output signal of the NAND gate G40 and an output signal of the NAND gate G42 and outputs the operation result. The NAND gate G42 performs an NAND operation for the output signal of the NAND gate G41, the test mode exit signal /EXIT and the start signal /START and outputs the operation result. The inverter I40 inverts the output signal of the NAND gate G41 and outputs the inverted signal. The inverter I41 inverts the output signal of the inverter I40 and outputs the inverted signal as the test mode signal Ti.

Figure 5:
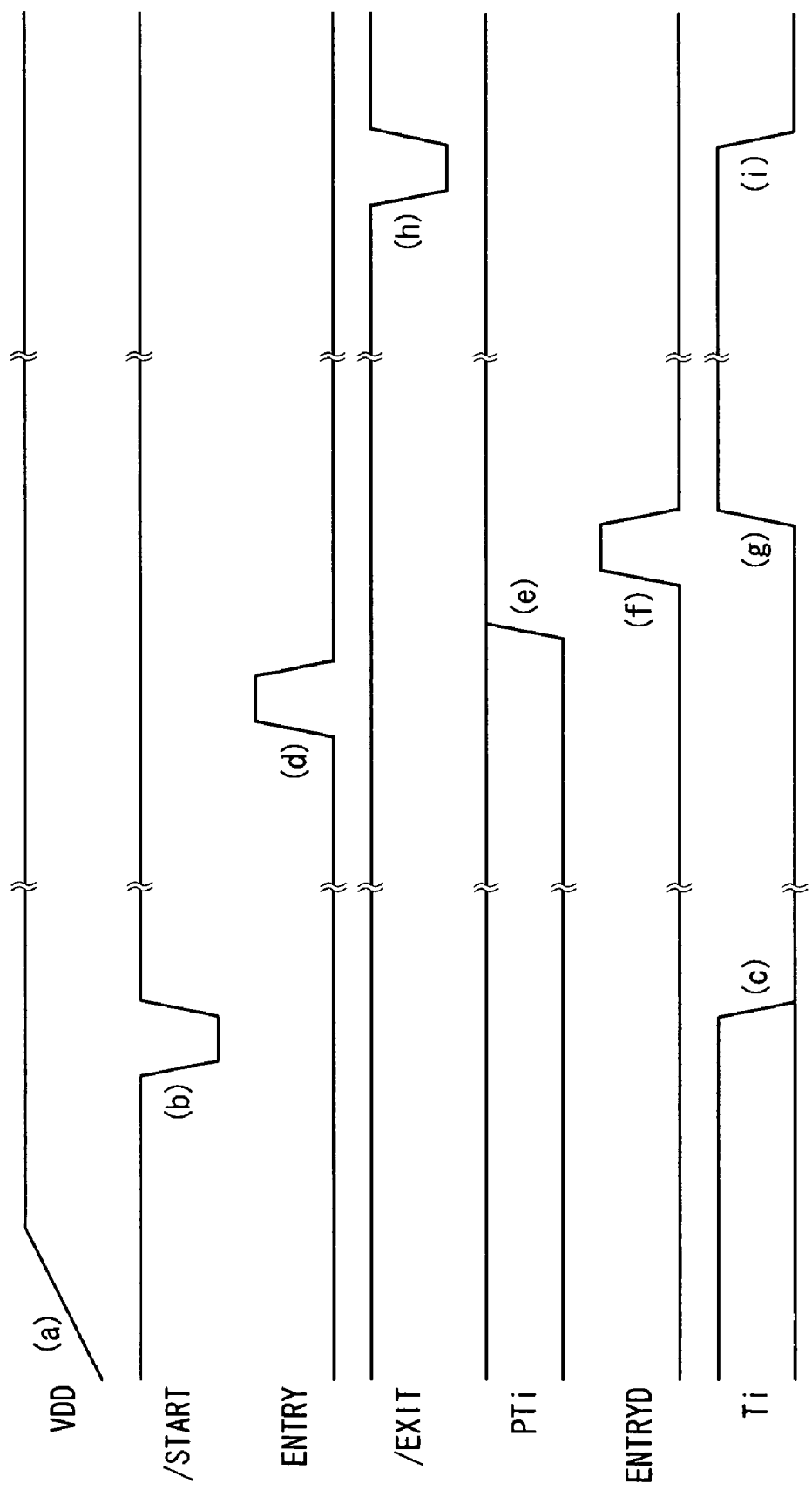
FIG. 5 is a signal-flow diagram illustrating an operation of a test mode signal generating circuit in FIG. 4.

FIG. 5 illustrates an operation of a test mode signal generating circuit in FIG. 4. If the semiconductor device SD10 is powered, the power supply voltage VDD rises ((a) of FIG. 5). When the start signal /START supplied from the control signal generating circuit CGCT is activated to '0' ((b) of FIG. 5), the test mode signal Ti supplied from the output circuit OCi of the test mode signal generating circuit TGC is inactivated to '0' ((c) of FIG. 5).

Thereafter, if the command signal CMD for indicating the test mode entry command (the address signals TA0 and TA1 indicate a decimal 'i') is input to the control signal generating circuit CGCT and the test mode entry signal ENTRY supplied from the control signal generating circuit CGCT is activated to '1' ((d) of FIG. 5), the test mode signal PTi supplied from the decode circuit DEC of the test mode signal generating circuit TGC is activated to '1' ((e) of FIG. 5). Furthermore, if the test mode entry signal ENTRYD supplied from the delay circuit DLY is activated to '1' after a predetermined time elapses from the activation of the test mode entry signal ENTRY ((f) of FIG. 5), the test mode signal Ti is activated to '1' ((g) of FIG. 5). Thereafter, if the command signal CMD for indicating the test mode exit command is input to the control signal generating circuit CGCT and the test mode exit signal /EXIT supplied from the control signal generating circuit CGCT is activated to '0' ((h) of FIG. 5), the test mode signal Ti is inactivated to '0' ((i) of FIG. 5).

Figure 6:
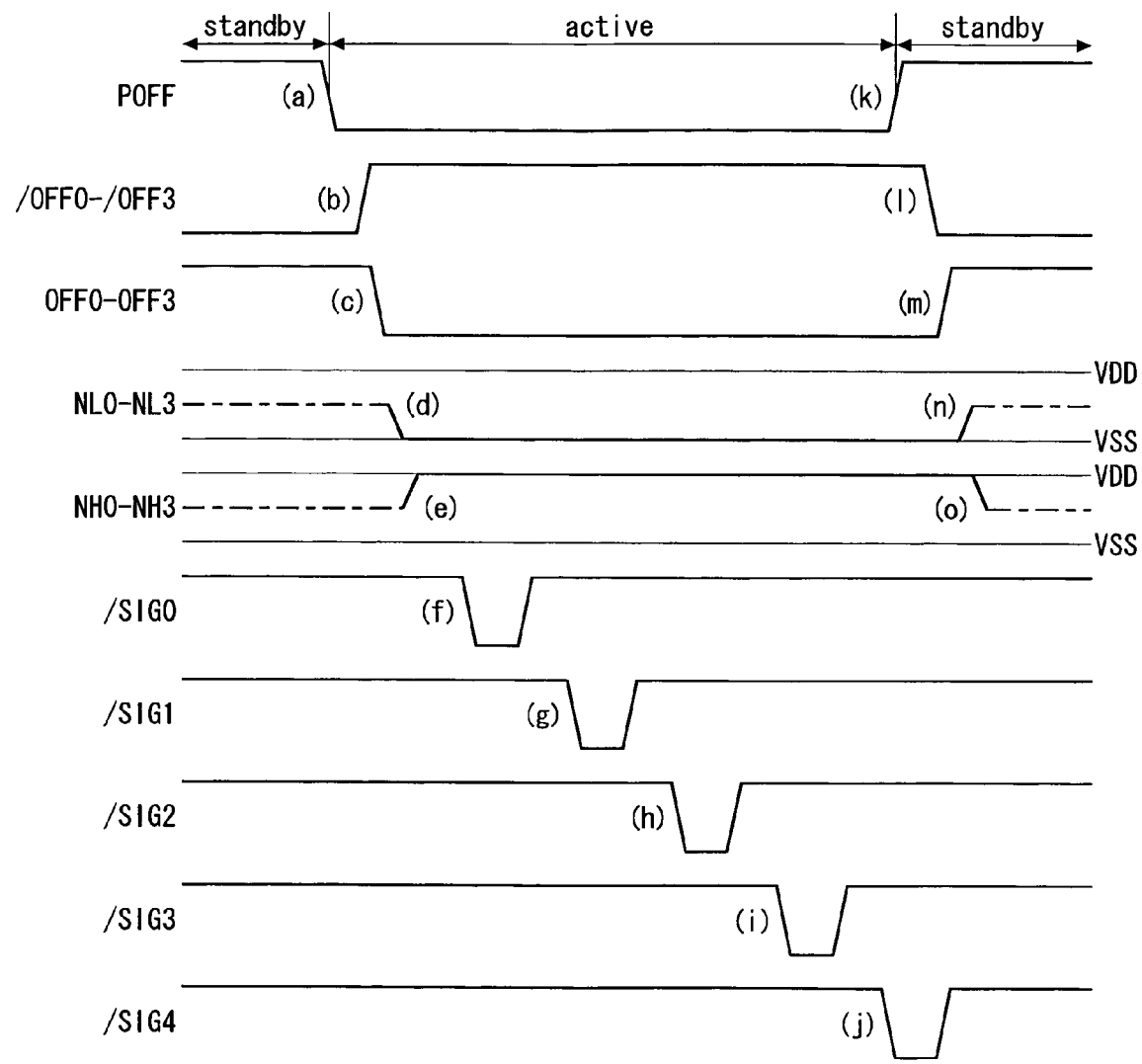
FIG. 6 is a signal-flow diagram illustrating an operation example (without defect) during a normal mode in a semiconductor device of FIG. 1.

FIG. 6 illustrates an operation example (without defect) during a normal mode in a semiconductor device of FIG. 1. In this operation example, the operation mode of the semiconductor device SD10 is the normal mode and the test mode signals T0 to T3 supplied from the test mode signal generating circuit TGC are respectively inactivated to '0'. In other words, all of the leakage cut-off transistors LTP0 to LTP3 and LTN0 to LTN3 are set to 'valid'.

In this state, if the semiconductor device SD10 shifts from the standby state to the active state, the leakage cut-off control signal POFF is inactivated to '0' ((a) of FIG. 6). The leakage cut-off control signals /OFF0 to /OFF3 supplied from the leakage cut-off control circuits LCC0 to LCC3 are respectively inactivated to '1' in response to the inactivation of the leakage cut-off control signal POFF ((b) of FIG. 6). The leakage cut-off control signals OFF0 to OFF3 supplied from the leakage cut-off control circuits LCC0 to LCC3 are respectively inactivated to '0' in response to the inactivation of the leakage cut-off control signals /OFF0 to /OFF3 ((c) of FIG. 6). Since the leakage cut-off transistors LTP0 to LTP3 and LTN0 to LTN3 are turned on, each of voltages of nodes NL0 to NL3 within the circuit blocks BLK0 to BLK3 is set to the ground voltage VSS ((d) of FIG. 6) and each of voltages of nodes NH0 to NH3 within the circuit blocks BLK0 to BLK3 is set to the power supply voltage VDD ((e) of FIG. 6). In addition, if the internal signal /SIG0 is activated to '0' ((f) of FIG. 6), the internal signals /SIG1, /SIG2, /SIG3 and /SIG4 are sequentially activated to '0' ((g), (h), (i) and (j) of FIG. 6).

Meanwhile, if the semiconductor device SD10 shifts from the active state to the standby state, the leakage cut-off control signal POFF is activated to '1' ((k) of FIG. 6). The leakage cut-off control signals /OFF0 to /OFF3 are respectively activated to '0' in response to the activation of the leakage cut-off control signal POFF ((l) of FIG. 6). The leakage cut-off control signals OFF0 to OFF3 are respectively activated to '1' in response to the activation of the leakage cut-off control signals /OFF0 to /OFF3 ((m) of FIG. 6). Since the leakage cut-off transistors LTP0 to LTP3 and LTN0 to LTN3 are turned off, voltages of the nodes NL0 to NL3 and voltages of the nodes NH0 to NH3 become undefined ((n) and (o) of FIG. 6). If the semiconductor device SD10 operates as in the operation example of FIG. 6 in the normal mode, the result of the function test during the normal mode in the test process is a pass. Accordingly, the semiconductor device SD10 is determined to be a good product.

Figure 7:
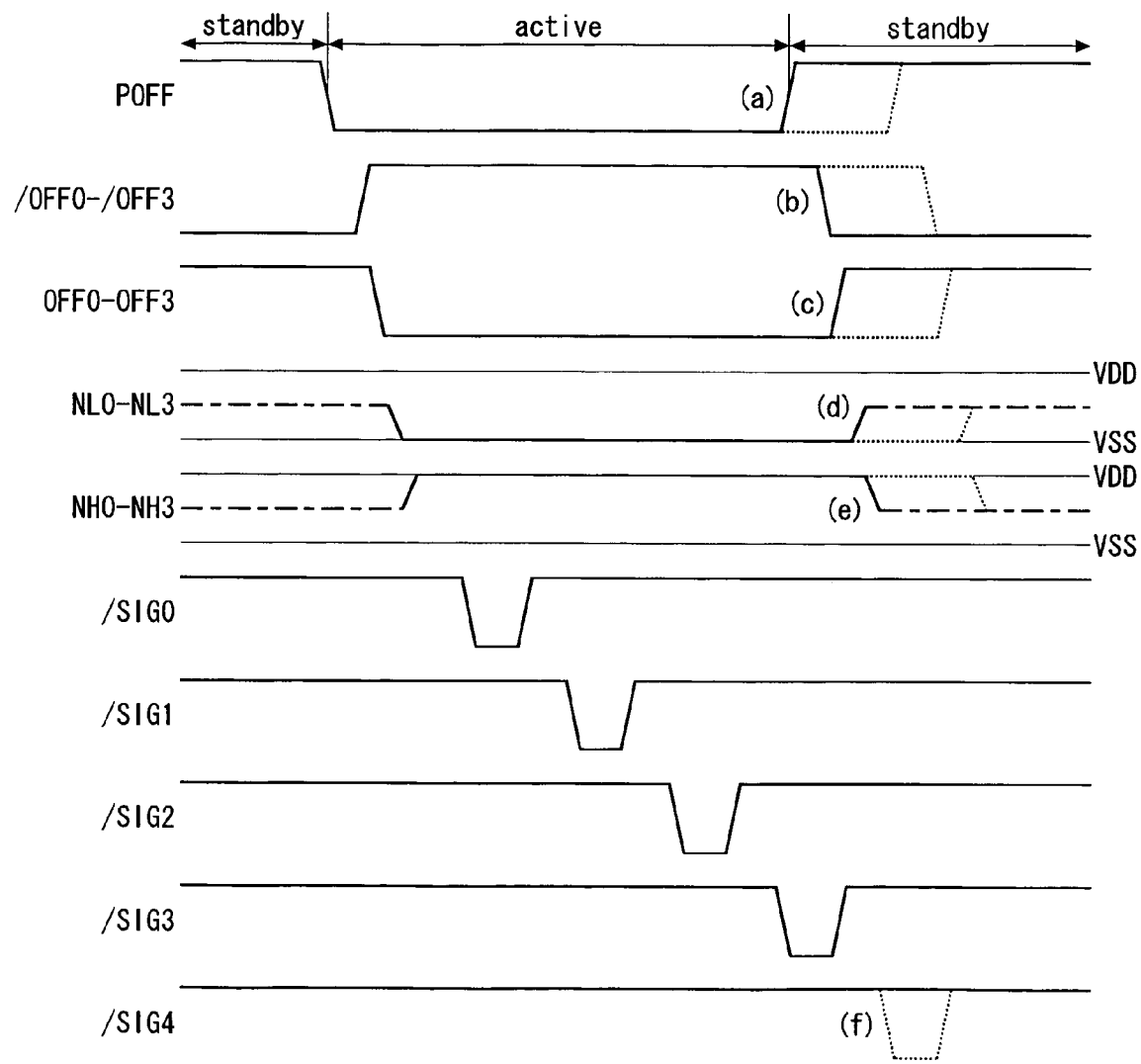
FIG. 7 is a signal-flow diagram illustrating an operation example (with defect) during a normal mode in a semiconductor device of FIG. 1.

FIG. 7 illustrates an operation example (with defect) during a normal mode in a semiconductor device of FIG. 1. In this operation example, the activation timing of the leakage cut-off control signal POFF is earlier than that of the operation example of FIG. 6 (a dotted line in the drawing) ((a) of FIG. 7). Therefore, the activation timings of the leakage cut-off control signals /OFF0 to /OFF3 and OFF0 to OFF3 are earlier than those of the operation example of FIG. 6 ((b) and (c) of FIG. 7). Due to this, off timings of the leakage cut-off transistors LTP0 to LTP3 and LTN0 to LTN3 come earlier and voltages of the nodes NL0 to NL3 and the nodes NH0 to NH3 go unstable immediately after the internal signal /SIG3 is inactivated ((d) and (e) of FIG. 7). Consequently, the internal signal /SIG4 is not activated ((f) of FIG. 7). If the semiconductor device SD10 operates as in the operation example of FIG. 7 during the normal mode, the result of the function test during the normal mode in the test process will be a fail. Accordingly, the semiconductor device SD10 is determined to be a defective product.

In the test process of the semiconductor device SD10, if the result of the function test during the normal mode is a fail, defect analysis of the semiconductor device SD10 can be performed as follows. First, the command signal CMD for indicating the test mode entry command is input four times while sequentially setting the address signals TA[1:0] (the address signals TA1 and TA0) to '00', '01', '10' and '11', respectively, thereby activating all of the test mode signals T0 to T3 to '1'. As a result, all of the leakage cut-off transistors LTP0 to LTP3 and LTN0 to LTN3 are set to 'invalid'. When the result of the function test is a pass in this state, it is determined that defects have occurred due to the leakage cut-off function. When it is determined that defects have occurred due to the leakage cut-off function, all of the test mode signals T0 to T3 are inactivated to '0' by inputting the command signal CMD for indicating the test mode exit command. Accordingly, all of the leakage cut-off transistors LTP0 to LTP3 and LTN0 to LTN3 are set to 'valid'.

Next, in a state where the address signal TA[1:0] is set to '00', the test mode signal T0 is activated to '1' by inputting the command signal CMD for indicating the test mode entry command. As a result, only the leakage cut-off transistors LTP0 and LTN0 are set to 'invalid'. In this state, if the result of the function test is a pass, it is determined that defects have occurred in the circuit block BLK0 due to the leakage cut-off function. Meanwhile, if the result of the function test is a fail, the test mode signal T0 is inactivated to '0' by inputting the command signal CMD for indicating the test mode exit command. Accordingly, the leakage cut-off transistors LTP0 and LTN0 are set to 'valid' again.

Next, in a state where the address signal TA[1:0] is set to '01', the test mode signal T1 is activated to '1' by inputting the command signal CMD for indicating the test mode entry command. As a result, only the leakage cut-off transistors LTP1 and LTN1 are set to 'invalid'. In this state, if the result of the function test is a pass, it is determined that defects have occurred in the circuit block BLK1 due to the leakage cut-off function. Meanwhile, if the result of the function test is a fail, the test mode signal T1 is inactivated to '0' by inputting the command signal CMD for indicating the test mode exit command. Accordingly, the leakage cut-off transistors LTP1 and LTN1 are set to 'valid' again.

Next, in a state where the address signal TA[1:0] is set to '10', the test mode signal T2 is activated to '1' by inputting the command signal CMD for indicating the test mode entry command. As a result, only the leakage cut-off transistors LTP2 and LTN2 are set to 'invalid'. In this state, if the result of the function test is a pass, it is determined that defects have occurred in the circuit block BLK2 due to the leakage cut-off function. Meanwhile, if the result of the function test is a fail, the test mode signal T2 is inactivated to '0' by inputting the command signal CMD for indicating the test mode exit command. Accordingly, the leakage cut-off transistors LTP2 and LTN2 are set to 'valid' again.

Thereafter, in a state where the address signal TA[1:0] is set to '11', the test mode signal T3 is activated to '1' by inputting the command signal CMD for indicating the test mode entry command. As a result, only the leakage cut-off transistors LTP3 and LTN3 are set to 'invalid'. In this state, if the result of the function test is a pass, it is determined that defects have occurred in the circuit block BLK3 due to the leakage cut-off function. For example, if the semiconductor device SD10 operates in the same manner as the operation example of FIG. 7 during the normal mode, a pass is determined as the result of the function test in this state and it is determined that defects have occurred in the circuit block BLK3 due to the leakage cut-off function.

Figure 8:
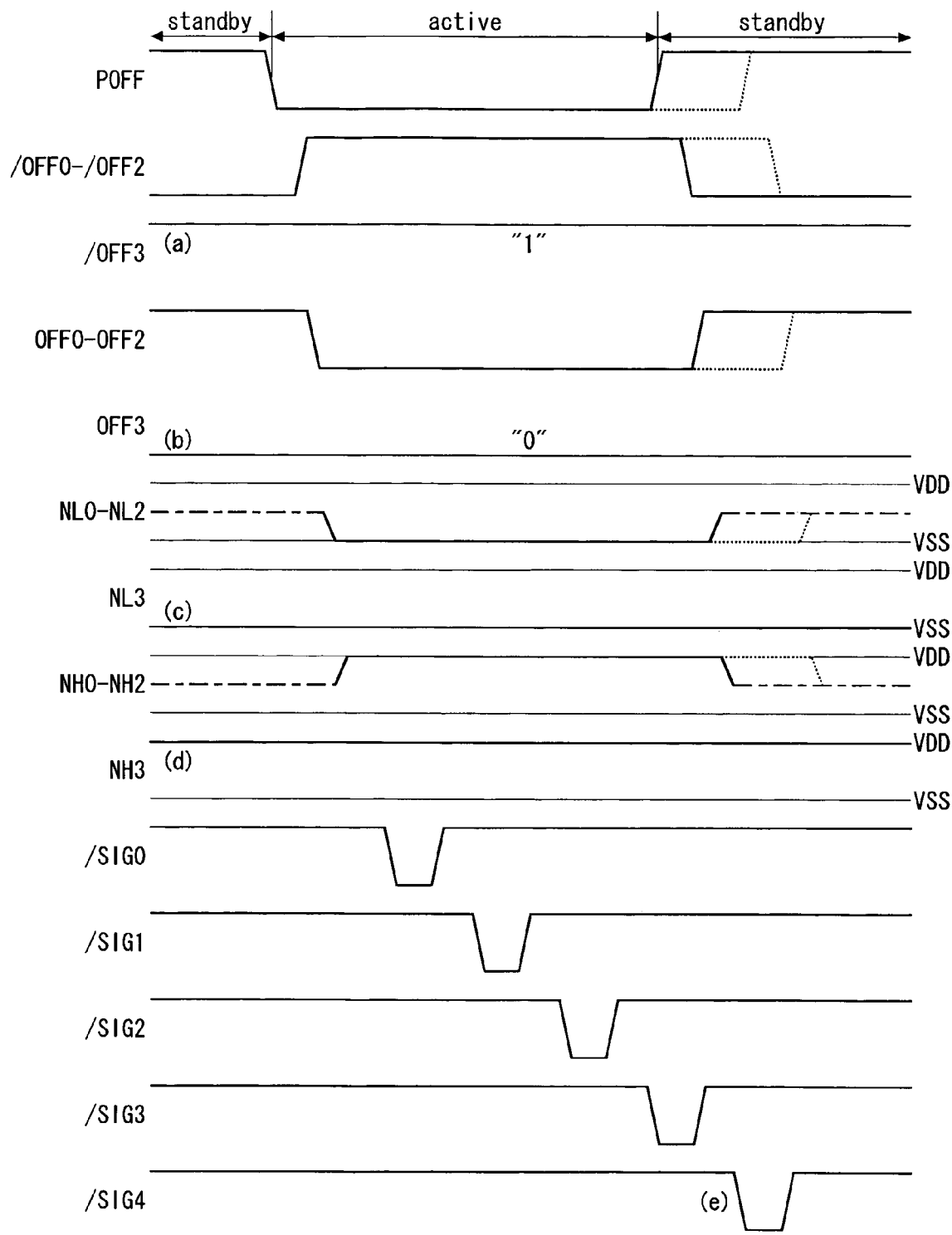
FIG. 8 is a signal-flow diagram illustrating an operation example (with defect) during a test mode in a semiconductor device of FIG. 1.

FIG. 8 illustrates an operation example (with defect) during a test mode in a semiconductor device of FIG. 1. This operation example corresponds to the operation of the semiconductor device SD10 during the test mode, which operates in the same manner as the operation example of FIG. 7 during the normal mode. In this operation example, the operation mode of the semiconductor device SD10 is the test mode, and the test mode signals T0 to T2 are respectively inactivated to '0' and the test mode signal T3 is activated to '1'. Accordingly, the leakage cut-off control signal /OFF3 is always inactivated to '1' ((a) of FIG. 8) and the leakage cut-off control signal OFF3 is always inactivated to '0' ((b) of FIG. 8). In other words, the leakage cut-off transistors LTP3 and LTN3 are set to 'invalid'. Therefore, a voltage of the node NL3 within the circuit block BLK3 is always set to the ground voltage VSS ((c) of FIG. 8) and a voltage of the node NH3 within the circuit block BLK3 is always set to the power supply voltage VDD ((d) of FIG. 8). For this reason, even when the semiconductor device SD10 operates in the same manner as the operation example of FIG. 7 during the normal mode, the internal signal /SIG4 is activated to '0' ((e) of FIG. 8) in the same manner as the operation example of FIG. 6. Therefore, in the case where in the test process of the semiconductor device SD10, the result of the function test performed in the normal mode is a fail, through the above-mentioned processings, the result will be a pass when the function test is performed in a state where only the test mode signal T3 is activated to '1'. This can lead to specifying that the circuit block BLK3 is the one having defects due to the leakage cut-off function. As described above, in the semiconductor device SD10 according to the first embodiment, it is possible to easily determine a location at which a defect has been occurred due to the leakage cut-off function and to improve the easiness of defect analysis.

Figure 9:
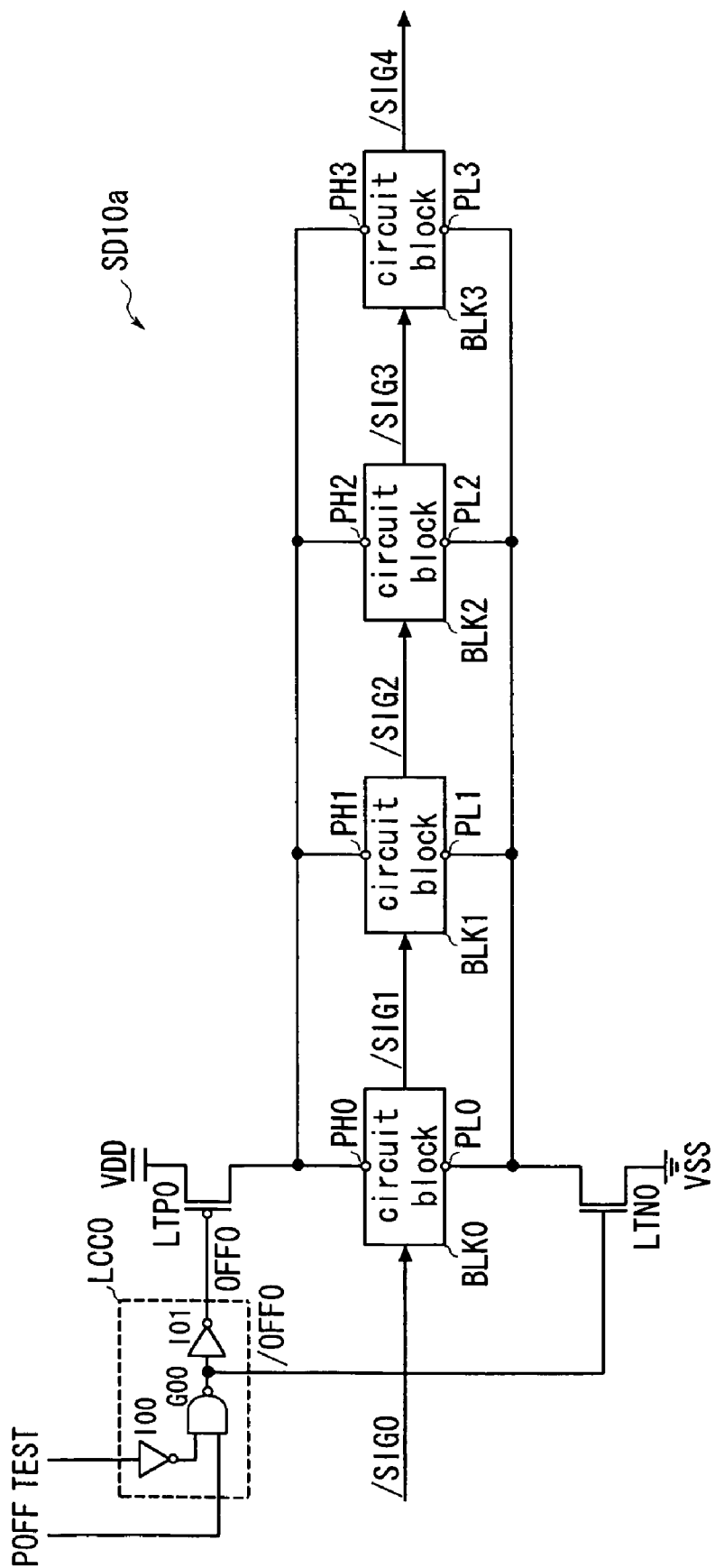
FIG. 9 is a circuit diagram showing a comparison example of the invention.

FIG. 9 shows a comparison example of the invention. In describing the comparison example, the same parts as those of the first embodiment are represented by the same reference numerals, and the descriptions thereof will be omitted. A semiconductor device SD10a includes a leakage cut-off control circuit LCC0, circuit blocks BLK0 to BLK3 and leakage cut-off transistors LTP0 and LTN0. The leakage cut-off control circuit LCC0 receives a test mode signal TEST as an input signal of an inverter 100. The test mode signal TEST is inactivated to '0' when the operation mode of the semiconductor device SD10a is the normal mode and is activated to '1' when the operation mode of the semiconductor device SD10a is the test mode. Therefore, the leakage cut-off transistors LTP0 and LTN0 are set to 'valid' when the operation mode of the semiconductor device SD10a is the normal mode and are set to 'invalid' when the operation mode of the semiconductor device SD10a is the test mode.

A power supply terminal PH1 of the circuit block BLK1, a power supply terminal PH2 of the circuit block BLK2 and a power supply terminal PH3 of the circuit block BLK3 are connected to a power supply line VDD through the leakage cut-off transistor LTP0 in the same manner as a power supply terminal PH0 of the circuit block BLK0. A power supply terminal PL1 of the circuit block BLK1, a power supply terminal PL2 of the circuit block BLK2 and a power supply terminal PL3 of the circuit block BLK3 are connected to a ground line VSS through the leakage cut-off transistor LTN0 in the same manner as a power supply terminal PL0 of the circuit block BLK0.

Figure 10:
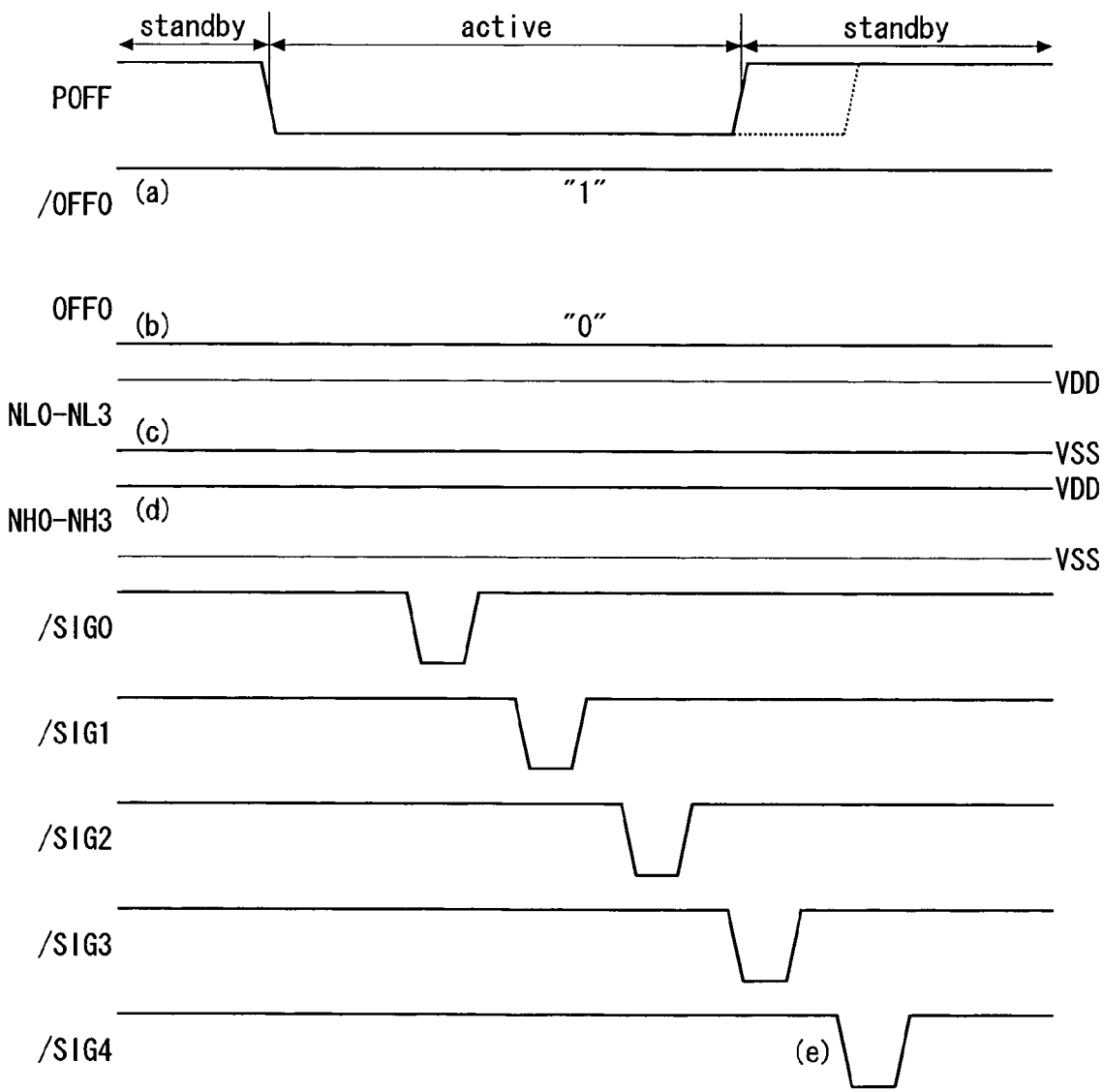
FIG. 10 is a signal-flow diagram illustrating an operation example (with defect) during a test mode in a semiconductor device of FIG. 9.

FIG. 10 illustrates an operation example (with defect) during a test mode in a semiconductor device of FIG. 9. This operation example corresponds to the operation of the semiconductor device SD10a during the test mode, which operates in the same manner as the operation example of FIG. 7 during the normal mode. In the operation example, the operation mode of the semiconductor device SD10a is the test mode and the test mode signal TEST is activated to '1'. Due to this, the leakage cut-off control signal /OFF0 is always inactivated to '1' ((a) of FIG. 10) and the leakage cut-off control signal OFF0 is always inactivated to '0' ((b) of FIG. 10). In other words, the leakage cut-off transistors LTP0 and LTN0 are set to 'invalid'. Therefore, voltages of nodes NL0 to NL3 within the circuit blocks BLK0 to BLK3 are always set to the ground voltage VSS ((c) of FIG. 10) and voltages of nodes NH0 to NH3 within the circuit blocks BLK0 to BLK3 are always set to the power supply voltage VDD ((d) of FIG. 10). Therefore, even when the semiconductor device SD10a operates in the same manner as the operation example of FIG. 7 during the normal mode, the internal signal /SIG4 is activated to '0' ((e) of FIG. 10) in the same manner as the operation example of FIG. 6.

Accordingly, in the test process of the semiconductor device SD10a, if the result of the function test during the normal mode is a fail, the result will become a pass when the function test is performed again in the test mode. This reveals that defects have occurred due to the leakage cut-off function. However, it is not able to specify that the circuit block BLK3 is the one having defects due to the leakage cut-off function. As described above, in the semiconductor device SD10a of the comparison example, it is not possible to specify a location at which a defect has been occurred due to the leakage cut-off function. Therefore, efficient defect analysis is not feasible, consuming an enormous amount of time.

Figure 11:
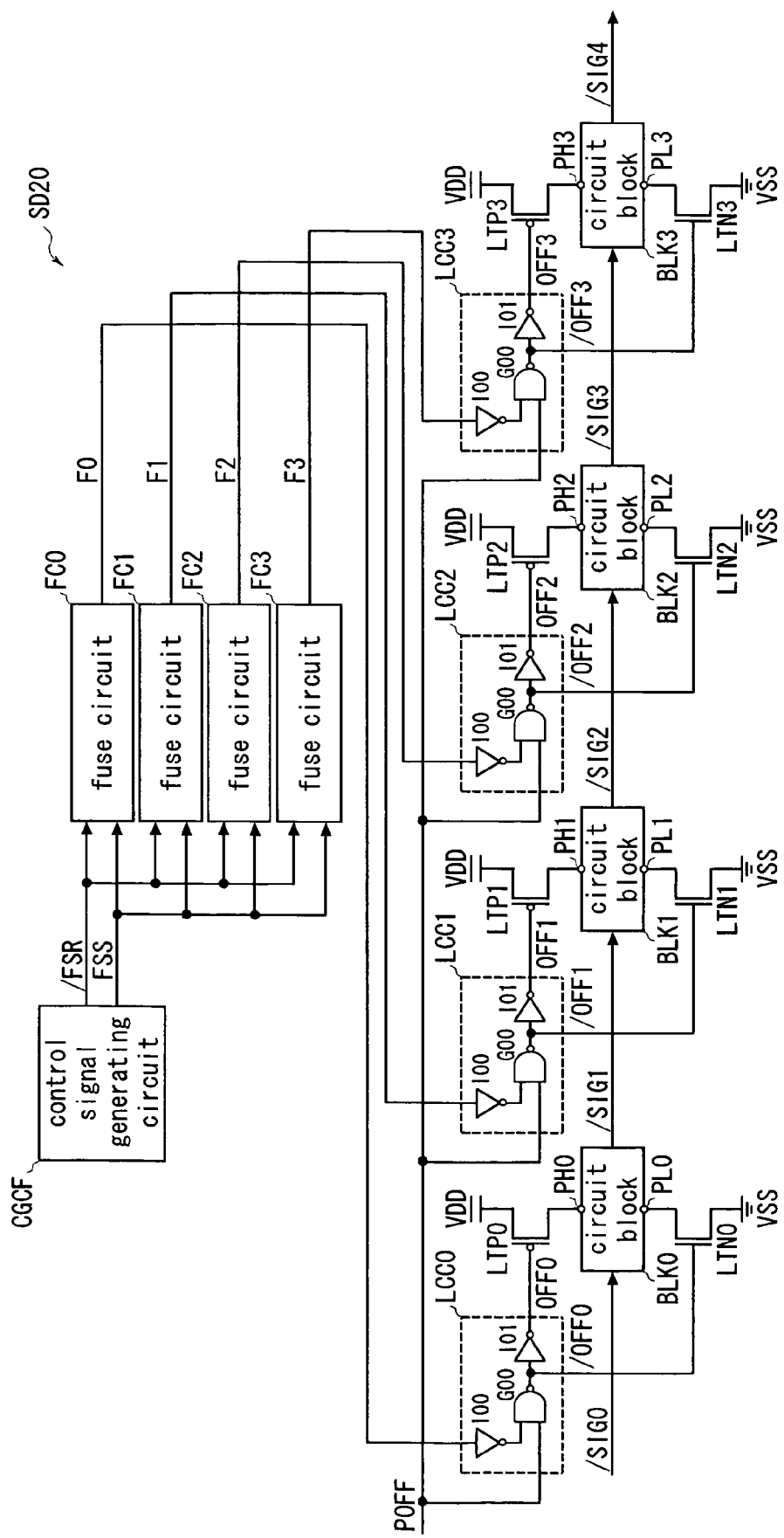
FIG. 11 is a circuit diagram showing a second embodiment of the invention.

FIG. 11 shows a second embodiment of the invention. In describing the second embodiment, the same parts are represented by the same reference numerals, and the descriptions thereof will be omitted. A semiconductor device SD20 according to the second embodiment may be mounted in an electronics device having the function block construction as shown in FIGS. 2(a) to 2(d) in the same manner as the semiconductor device SD10 according to the first embodiment. The semiconductor device SD20 may implement at least one of the function blocks. The semiconductor device SD20 includes a control signal generating circuit CGCF, fuse circuits FC0 to FC3 (storage circuits), leakage cut-off control circuits LCC0 to LCC3, circuit blocks BLK0 to BLK3 and leakage cut-off transistors LTP0 to LTP3 and LTN0 to LTN3.

The control signal generating circuit CGCF temporarily activates a fuse reset signal /FSR to '0' when the semiconductor device SD20 is powered. The control signal generating circuit CGCF temporarily activates a fuse set signal FSS to '1' after the fuse reset signal /FSR is inactivated. The fuse circuit FCi (i=0, 1, 2, 3) outputs a fuse state signal Fi (a storage state signal) for indicating whether a fuse FS is blown or not on the basis of the fuse reset signal /FSR and the fuse set signal FSS. The leakage cut-off control circuit LCCi receives the fuse state signal Fi as an input signal of an inverter 100. Therefore, the leakage cut-off transistors LTPi and LTNi are set to 'valid' when the fuse state signal Fi is inactivated to '0' and are set to 'invalid' when the fuse state signal Fi is activated to '1'.

Figure 12:
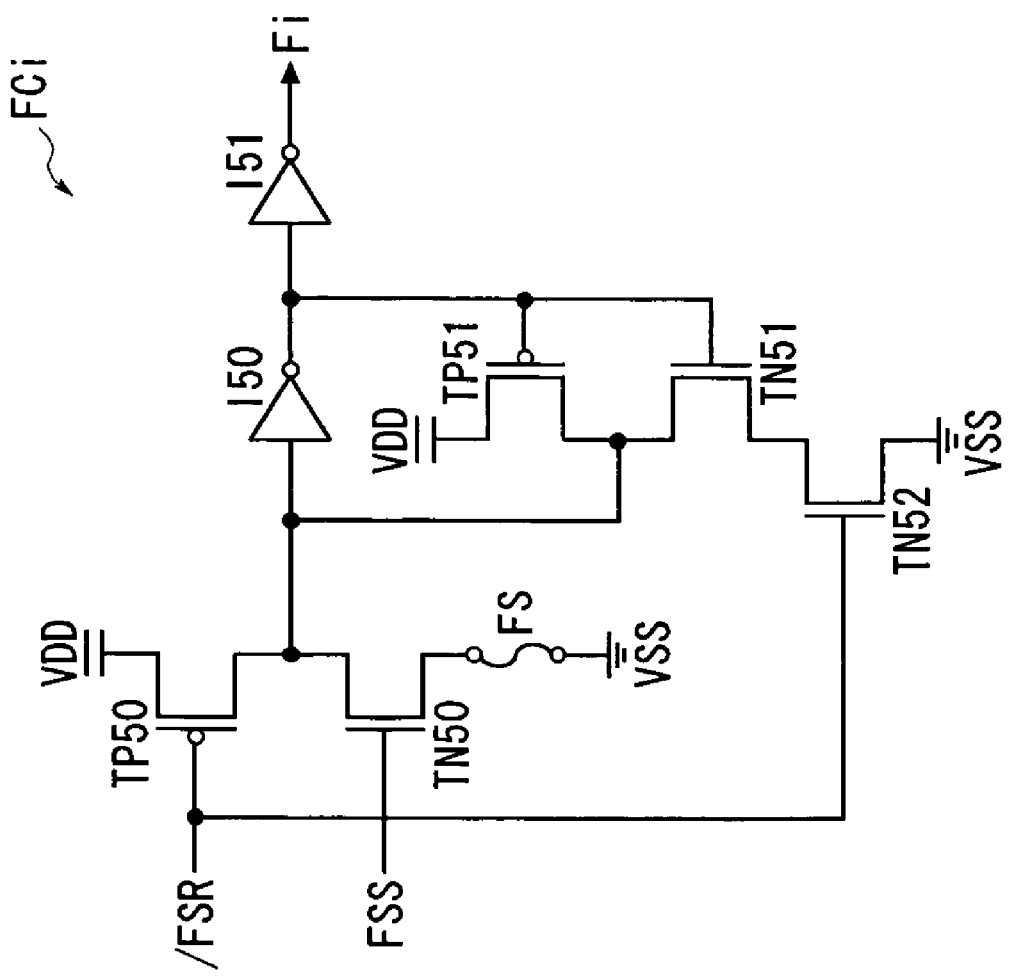
FIG. 12 is a circuit diagram showing a fuse circuit in FIG. 11.

FIG. 12 shows a fuse circuit in FIG. 11. The fuse circuit FCi includes pMOS transistors TP50 and TP51, nMOS transistors TN50 to TN52, the fuse FS and inverters I50 and I51. The PMOS transistor TP50 has a source connected to the power supply line VDD. A drain of the pMOS transistor TP50 is connected to a drain of the nMOS transistor TN50. The nMOS transistor TN50 has a source connected to the ground line VSS through the fuse FS. The pMOS transistor TP50 has a gate to which the fuse reset signal /FSR is input. The nMOS transistor TN50 has a gate to which the fuse set signal FSS is input.

The pMOS transistor TP51 has a source connected to the power supply line VDD. A drain of the PMOS transistor TP51 is connected to a drain of the nMOS transistor TN51. A source of the nMOS transistor TN51 is connected to a source of the nMOS transistor TN52. The nMOS transistor TN52 has a source connected to the ground line VSS. The pMOS transistor TP51 and the nMOS transistor TN51 have gates to which the output signal of the inverter I50 is input. The nMOS transistor TN52 has a gate to which the fuse reset signal /FSR is input. A connection node of the pMOS transistor TP50 and the nMOS transistor TN50, a connection node of the PMOS transistor TP51 and the nMOS transistor TN51 and an input terminal of the inverter I50 are interconnected. The inverter I51 inverts the output signal of the inverter I50 and outputs the inverted signal as the fuse state signal Fi.

Figure 13:
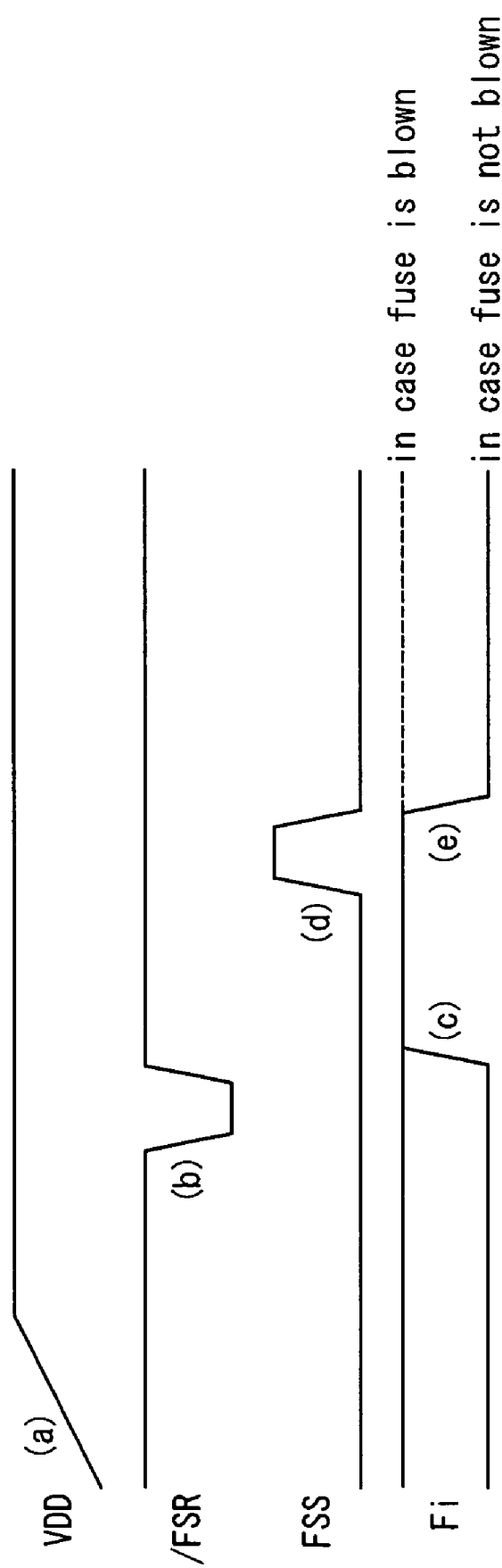
FIG. 13 is a signal-flow diagram illustrating an operation of a fuse circuit in FIG. 12.

FIG. 13 illustrates an operation of a fuse circuit in FIG. 12. If the semiconductor device SD20 is powered, the power supply voltage VDD rises ((a) of FIG. 13). If the fuse reset signal /FSR supplied from the control signal generating circuit CGCF is activated to '0' ((b) of FIG. 13), the PMOS transistor TP50 of the fuse circuit FCi is turned on and the nMOS transistor TN52 of the fuse circuit FCi is turned off. Since the output signal of the inverter I50 of the fuse circuit FCi is set to '0', the fuse state signal Fi supplied from the inverter I51 of the fuse circuit FCi is activated to '1' ((c) of FIG. 13). Furthermore, if the fuse reset signal /FSR is inactivated to '1', the pMOS transistor TP50 of the fuse circuit FCi is turned off and the nMOS transistor TN52 of the fuse circuit FCi is turned on.

If the fuse set signal FSS supplied from the control signal generating circuit CGCF is activated to '1' after the fuse reset signal /FSR is inactivated to '1' ((d) of FIG. 13), the nMOS transistor TN50 of the fuse circuit FCi is turned on. If the fuse FS of the fuse circuit FCi has not been blown, the output signal of the inverter I50 of the fuse circuit FCi changes from '0' to '1'. Accordingly, the fuse state signal Fi is inactivated to '0' ((e) of FIG. 13). Meanwhile, if the fuse FS of the fuse circuit FCi has been blown, the fuse state signal Fi is activated to '1' since the output signal of the inverter I50 of the fuse circuit FCi does not change from '0' to '1'. Therefore, the leakage cut-off transistors LTPi and LTNi are set to 'valid' when the fuse FS of the fuse circuit FCi is not blown and are set to 'invalid' when the fuse FS of the fuse circuit FCi is blown.

In the test process of the semiconductor device SD20 constructed as described above, the function test is performed in order to make a pass/fail determination. It is then determined whether the semiconductor device SD20 is good or defective based on the pass/fail determination. Furthermore, at this point, the fuses FS of the fuse circuits FC0 to FC3 are not blown. If the result of the function test is a fail, the function test can be sequentially performed while the fuses FS is blown in order of the fuse circuits FC0, FC1, FC2 and FC3. A location at which a defect has been occurred due to the leakage cut-off function can be easily determined based on the pass/fail determination and the state (blown or non-blown state) of the fuses FS at the fuse circuits FC0 to FC3. For example, if the semiconductor device SD20 can be operated in the same manner as the operation example of FIG. 7 in a state where all of the fuses FS of the fuse circuits FC0 to FC3 are not blown, a pass is obtained through the function test performed in a state where the fuse FS of the fuse circuit FC3 is blown. Accordingly, it is possible to specify that the circuit block BLK3 is the one having defects due to the leakage cut-off function. As described above, in the semiconductor device SD20 according to the second embodiment, a location at which a defect has been occurred due to the leakage cut-off function can be easily determined so as to improve the easiness of defect analysis in the same manner as the semiconductor device SD10 according to the first embodiment.

Figure 14:
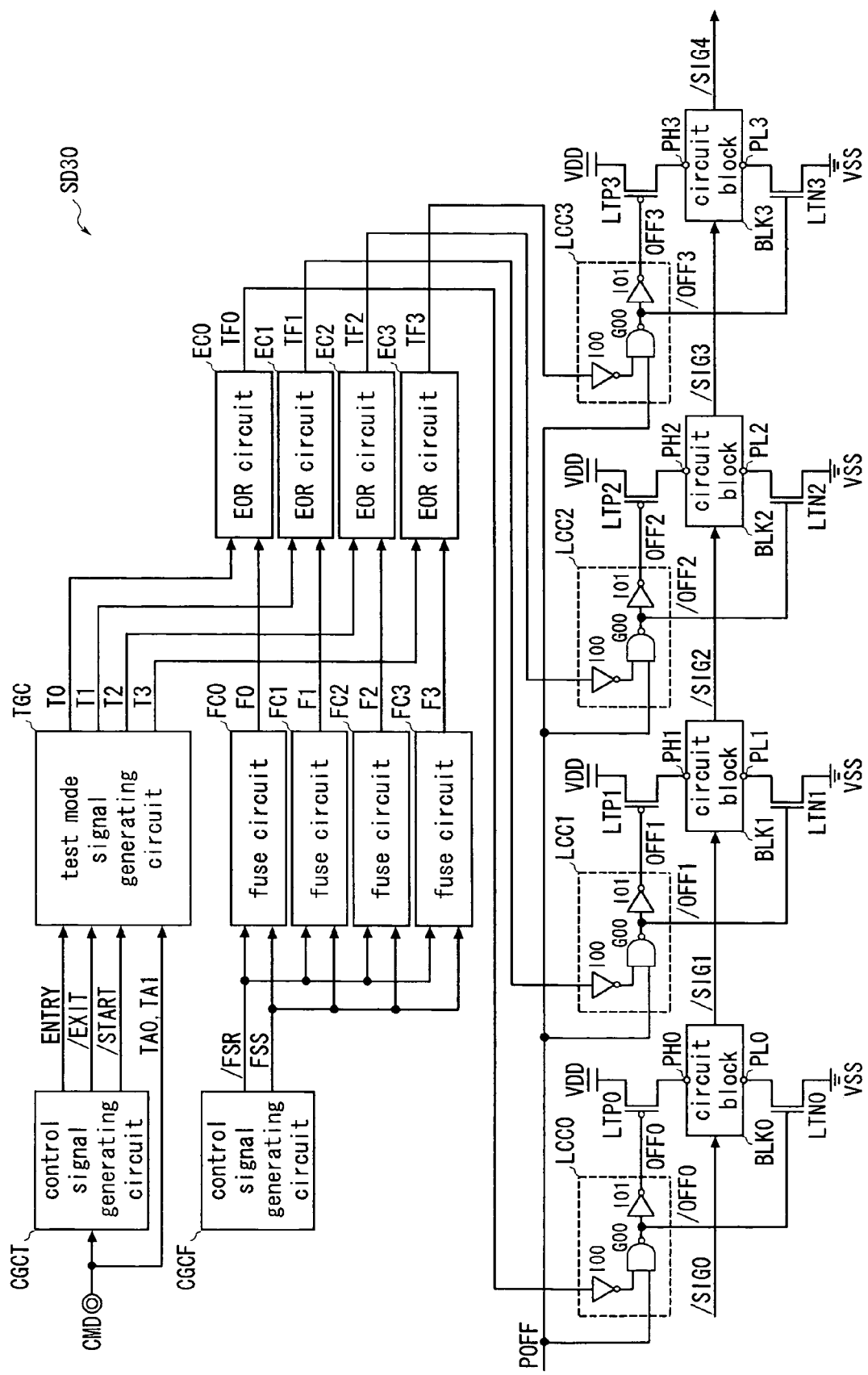
FIG. 14 is a circuit diagram showing a third embodiment of the invention.

FIG. 14 shows a third embodiment of the invention. In the third embodiment, the same parts are represented by the same reference numerals as those of the first and second embodiments, and the descriptions thereof will be omitted. A semiconductor device SD30 according to the third embodiment may be mounted in an electronics device having the function block construction as shown in FIGS. 2(a) to 2(d) in the same manner as the semiconductor device SD10 according to the first embodiment. The semiconductor device SD30 may implement at least one of the function blocks.

The semiconductor device SD30 includes a control signal generating circuit CGCT, a test mode signal generating circuit TGC, a control signal generating circuit CGCF, fuse circuits FC0 to FC3, EOR circuits EC0 to EC3 (a uniting circuit), leakage cut-off control circuits LCC0 to LCC3, circuit blocks BLK0 to BLK3 and leakage cut-off transistors LTP0 to LTP3 and LTN0 to LTN3. The EOR circuit ECi (i=0, 1, 2, 3) performs an exclusive OR operation on a test mode signal Ti received from the test mode signal generating circuit TGC and a fuse state signal Fi received from the fuse circuit FCi and outputs the operation result as a control signal TFi (a second control signal). The leakage cut-off control circuit LCCi receives the control signal TFi as an input signal of an inverter 100. Therefore, the leakage cut-off transistors LTPi and LTNi are set to 'valid' when the control signal TFi is inactivated to '0' and are set to 'invalid' when the control signal TFi is activated to '1'.

Figure 15:
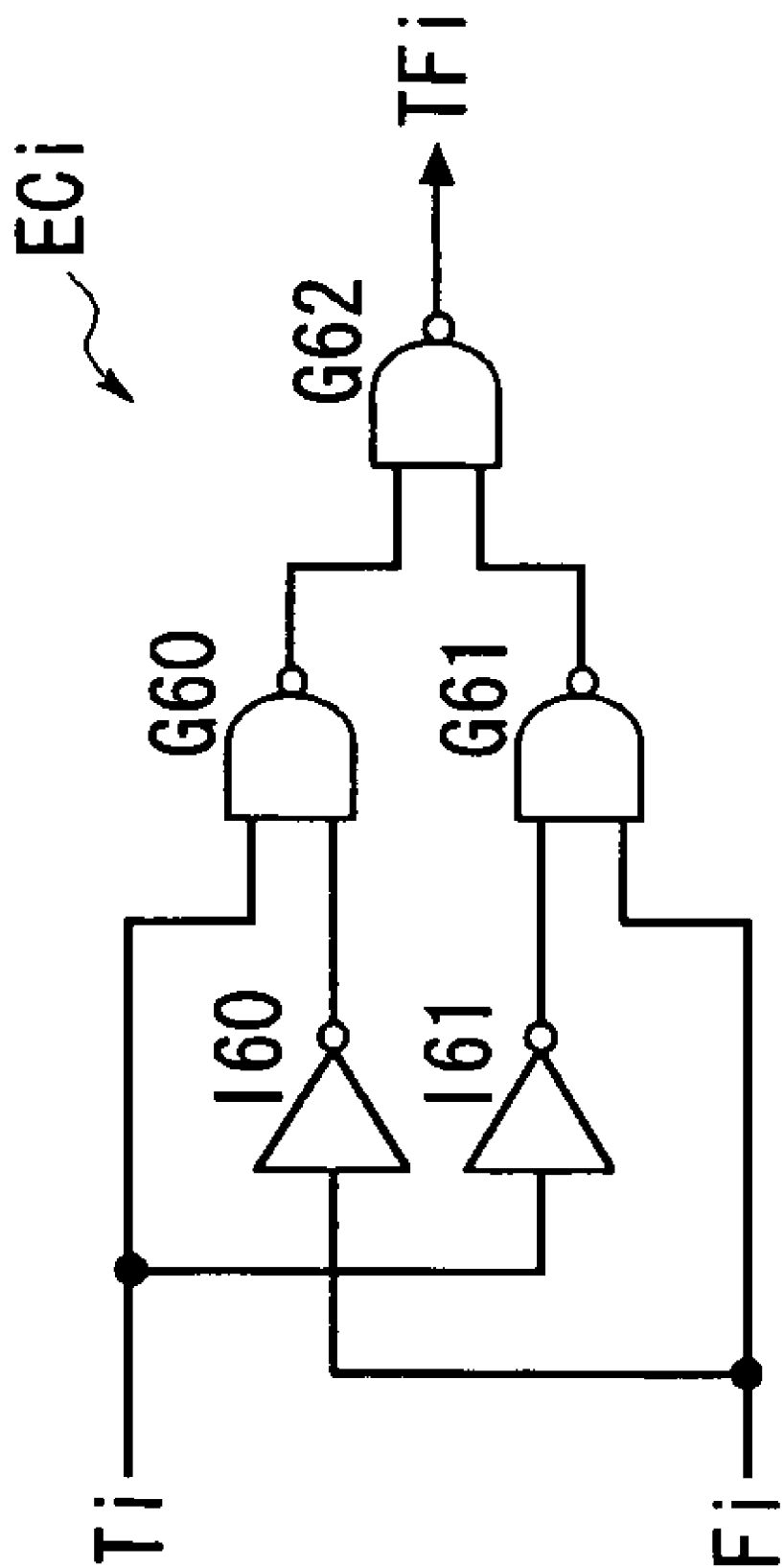
FIG. 15 is a circuit diagram showing an EOR circuit in FIG. 14.

FIG. 15 shows an EOR circuit in FIG. 14. The EOR circuit ECi includes inverters I60 and I61 and NAND gates G60 to G62. The inverter I60 inverts the fuse state signal Fi received from the fuse circuit FCi and outputs the inverted signal. The inverter I61 inverts the test mode signal Ti received from the test mode signal generating circuit TGC and outputs the inverted signal. The NAND gate G60 performs an NAND operation for the test mode signal Ti and an output signal of the inverter I60 and outputs the operation result. The NAND gate G61 performs an NAND operation for an output signal of the inverter I61 and the fuse state signal Fi and outputs the operation result. The NAND gate G62 performs an NAND operation for an output signal of the NAND gate G60 and an output signal of the NAND gate G61 and outputs the operation result. Through such a circuit construction, the control signal TFi is activated to '1' when either the test mode signal Ti or the fuse state signal Fi is activated to '1'. The control signal TFi is inactivated to '0' when both the test mode signal Ti and the fuse state signal Fi are inactivated to '0' or when both the test mode signal Ti and the fuse state signal Fi are activated to '1'.

In the case where the semiconductor device SD30 constructed as described above operates in the same manner as the operation example of FIG. 7 during the normal mode, the result of the function test performed during the normal mode in the test process will be a fail. In this case, it is possible to specify that the circuit block having defects due to the leakage cut-off function is the circuit block BLK3, by performing the same defect analysis as that of the first embodiment. Therefore, defect analysis can be also performed within a short period of time in the semiconductor device SD30 of the third embodiment as in the semiconductor device SD10 according to the first embodiment.

Furthermore, if the fuse FS of the fuse circuit FC3 corresponding to the circuit block BLK3 having defects is blown, the result of the function test performed in the normal mode will be a pass. However, off-state leakage current is not reduced in the circuit block BLK3 and power consumption in the standby period of the semiconductor device SD30 slightly increases. However, if the power consumption increase does not cause a problem to a user of the semiconductor device SD30, the semiconductor device SD30 can be provided as a good product without waiting for correcting defects.

The invention is not limited to the above embodiments and various modifications may be made without departing from the spirit and scope of the invention. Any improvement may be made in part or all of the components.

What is claimed is:

1. A semiconductor device comprising:
   a plurality of circuit blocks;
   a plurality of switch circuits disposed so as to correspond to said plurality of circuit blocks, respectively, and connected between a power supply terminal of a corresponding circuit block and a power supply line;
   a setting circuit which sets each of said plurality of switch circuits to be in a valid or invalid state; and
   a switch control circuit that turns on each of said plurality of switch circuits in accordance with a first control signal when it is set in the valid state by said setting circuit, and turns on each of said plurality of switch circuits regardless of the first control signal when it is set in the invalid state by said setting circuit, the first control signal being for indicating an operation state of said plurality of circuit blocks.

2. The semiconductor device according to claim 1, wherein:
   said setting circuit includes a test mode circuit that inactivates in a normal mode a plurality of test mode signals corresponding to said plurality of switch circuits respectively, and activates in a test mode one of the plurality of test mode signals designated by test mode information; and
   said switch control circuit turns on each of said plurality of switch circuits in accordance with the first control signal when a corresponding test mode signal is inactivated, and turns on each of said plurality of switch circuits regardless of the first control signal when the corresponding test mode signal is activated.

3. The semiconductor device according to claim 1, wherein:
   said setting circuit includes a plurality of storage circuits which are disposed so as to correspond to said plurality of switch circuits respectively, store validity or invalidity of a corresponding switch circuit, and activates a storage state signal when storing the invalidity; and
   said switch control circuit turns on each of said plurality of switch circuits in accordance with the first control signal when a corresponding storage state signal is inactivated, and turns on each of said plurality of switch circuits regardless of the first control signal when the corresponding storage state signal is activated.

4. The semiconductor device according to claim 3, wherein
   each of said plurality of storage circuits includes a fuse circuit programming validity or invalidity of the corresponding switch circuit.

5. The semiconductor device according to claim 1, wherein said setting circuit includes:
   a test mode circuit which inactivates in a normal mode a plurality of test mode signals corresponding to said plurality of switch circuits respectively and activates in a test mode one of the plurality of test mode signals designated by test mode information;
   a plurality of storage circuits disposed so as to correspond to said plurality of switch circuits respectively, storing validity or invalidity of a corresponding switch circuit, and activating a storage state signal when storing the invalidity; and
   a uniting circuit that activates each of a plurality of second control signals corresponding to said plurality of switch circuits respectively when one of a corresponding test mode signal and a corresponding storage state signal is activated, wherein
   said switch control circuit turns on each of said plurality of switch circuits in accordance with the first control signal when a corresponding second control signal is inactivated, and turns on each of said plurality of switch circuits regardless of the first control signal when the corresponding second control signal is activated.

6. The semiconductor device according to claim 5, wherein
   each of said plurality of storage circuits includes a fuse circuit programming validity or invalidity of the corresponding switch circuit.

7. An electronics device comprising
   a semiconductor device having:
   a plurality of circuit blocks;
   a plurality of switch circuits disposed so as to correspond to said plurality of circuit blocks, respectively, and connected between a power supply terminal of a corresponding circuit block and a power supply line;
   a setting circuit which sets each of said plurality of switch circuits to be in a valid or invalid state; and
   a switch control circuit that turns on each of said plurality of switch circuits in accordance with a first control signal when it is set in the valid state by said setting circuit, and turns on each of said plurality of switch circuits regardless of the first control signal when it is set in the invalid state by said setting circuit, the first control signal being for indicating an operation state of said plurality of circuit blocks.

8. The electronics device according to claim 7, wherein:
said setting circuit includes a test mode circuit that inactivates in a normal mode a plurality of test mode signals corresponding to said plurality of switch circuits respectively, and activates in a test mode one of the plurality of test mode signals designated by test mode information; and
said switch control circuit turns on each of said plurality of switch circuits in accordance with the first control signal when a corresponding test mode signal is inactivated, and turns on each of said plurality of switch circuits regardless of the first control signal when the corresponding test mode signal is activated.

9. The electronics device according to claim 7, wherein:
said setting circuit includes a plurality of storage circuits which are disposed so as to correspond to said plurality of switch circuits respectively, store validity or invalidity of a corresponding switch circuit, and activates a storage state signal when storing the invalidity; and
said switch control circuit turns on each of said plurality of switch circuits in accordance with the first control signal when a corresponding storage state signal is inactivated, and turns on each of said plurality of switch circuits regardless of the first control signal when the corresponding storage state signal is activated.

10. The electronics device according to claim 9, wherein each of said plurality of storage circuits includes a fuse circuit programming validity or invalidity of the corresponding switch circuit.

11. The electronics device according to claim 7, wherein said setting circuit includes:
a test mode circuit which inactivates in a normal mode a plurality of test mode signals corresponding to said plurality of switch circuits respectively and activates in a test mode one of the plurality of test mode signals designated by test mode information;
a plurality of storage circuits disposed so as to correspond to said plurality of switch circuits respectively, storing validity or invalidity of a corresponding switch circuit, and activating a storage state signal when storing the invalidity; and
a uniting circuit that activates each of a plurality of second control signals corresponding to said plurality of switch circuits respectively when one of a corresponding test mode signal and a corresponding storage state signal is activated, wherein
said switch control circuit turns on each of said plurality of switch circuits in accordance with the first control signal when a corresponding second control signal is inactivated, and turns on each of said plurality of switch circuits regardless of the first control signal when the corresponding second control signal is activated.

12. The electronics device according to claim 11, wherein each of said plurality of storage circuits includes a fuse circuit programming validity or invalidity of the corresponding switch circuit.

* * * * *